US010459351B2

(12) United States Patent
Horn et al.

(10) Patent No.: US 10,459,351 B2
(45) Date of Patent: Oct. 29, 2019

(54) DEVICE FOR TRANSMITTING ELECTRICAL SIGNALS, AND LITHOGRAPHY APPARATUS

(71) Applicant: Carl Zeiss SMT GmbH, Oberkochen (DE)

(72) Inventors: Jan Horn, Munich (DE); Sascha Bleidistel, Aalen (DE); Florian Bart, Aalen (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/291,836

(22) Filed: Mar. 4, 2019

(65) Prior Publication Data

US 2019/0196343 A1 Jun. 27, 2019

Related U.S. Application Data

(63) Continuation of application No. PCT/EP2017/072460, filed on Sep. 7, 2017.

(30) Foreign Application Priority Data

Sep. 12, 2016 (DE) .......................... 10 2016 217 285

(51) Int. Cl.
*G03F 7/20* (2006.01)

(52) U.S. Cl.
CPC .......... *G03F 7/70808* (2013.01); *G03F 7/709* (2013.01); *G03F 7/70841* (2013.01);
(Continued)

(58) Field of Classification Search
CPC ........... H01L 21/67225; G03F 7/70841; G03F 7/70991; G03F 7/70975; G03F 7/7095;
(Continued)

(56) References Cited

U.S. PATENT DOCUMENTS

| | | | |
|---|---|---|---|
| 6,910,897 B2* | 6/2005 | Driscoll ................. | H01R 24/50 439/65 |
| 2002/0079464 A1* | 6/2002 | Driessen ................ | G01N 23/04 250/492.1 |

(Continued)

FOREIGN PATENT DOCUMENTS

| | | |
|---|---|---|
| EP | 1 052 549 A2 | 11/2000 |
| JP | 2005-106166 A | 4/2005 |

OTHER PUBLICATIONS

Translation of International Search Report for corresponding PCT Appl No. PCT/EP2017/072460, dated Jan. 22, 2018.

*Primary Examiner* — Christina A Riddle
(74) *Attorney, Agent, or Firm* — Fish & Richardson P.C.

(57) ABSTRACT

The disclosure relates to a device for transmitting electrical signals between a first interface element, arranged at a first structure of a lithography system, and a second interface element, arranged at a second structure of the lithography system. An electrical conductor connects the first interface element and the second interface element. The device has a hollow body which surrounds at least sections of the electrical conductor and which is designed to electromagnetically shield the electrical conductor. A gap is provided in the hollow body or between the hollow body and one of the structures and allows a relative movement of the first structure and the second structure to mechanically decouple the first structure from the second structure.

20 Claims, 9 Drawing Sheets

(52) U.S. Cl.
CPC ...... *G03F 7/70908* (2013.01); *G03F 7/70941* (2013.01); *G03F 7/70991* (2013.01)

(58) Field of Classification Search
CPC ............ G03F 7/70941; G03F 7/70908; G03F 7/70833; G03F 7/70825; G03F 7/70808; G03F 7/708; G03F 7/70033; G03F 7/70025; G03F 7/70141; G03F 7/7015; G03F 7/70166; G03F 7/702; G03F 7/70233; G03F 7/70258; G03F 7/70541; G03F 7/70858; G03F 7/70916; G03F 7/70933; G03F 7/709; H01B 7/041; H01B 7/40; H05K 9/0007
USPC ............... 355/30, 52, 53, 55, 67–71, 72–77; 250/492.1, 492.2, 492.22, 493.1, 548, 250/504 R, 442.11
See application file for complete search history.

(56) References Cited

U.S. PATENT DOCUMENTS

| | | | |
|---|---|---|---|
| 2006/0200942 A1* | 9/2006 | Zheng | E05D 11/0081 16/221 |
| 2009/0169661 A1* | 7/2009 | Vermeulen | G03F 7/70716 425/102 |
| 2010/0020525 A1 | 1/2010 | Butler et al. | |
| 2011/0149264 A1* | 6/2011 | Damen | H01R 12/592 355/72 |
| 2015/0090895 A1* | 4/2015 | Koning | G03F 7/708 250/396 R |
| 2016/0126055 A1 | 5/2016 | Koning et al. | |

\* cited by examiner

DEVICE FOR TRANSMITTING ELECTRICAL SIGNALS, AND LITHOGRAPHY APPARATUS

CROSS-REFERENCE TO RELATED APPLICATIONS

The present application is a continuation of, and claims benefit under 35 USC 120 to, international application PCT/EP2017/072460, filed Sep. 7, 2017, which claims benefit under 35 USC 119 of German Application No. 10 2016 217 285.9, filed Sep. 12, 2016. The entire disclosure of these applications are incorporated by reference herein.

FIELD

The present disclosure relates to a device for transmitting electrical signals, and a lithography apparatus comprising such a device.

BACKGROUND

Lithography is used to produce micro- and nanostructured components, such as integrated circuits, for example. The lithography process is carried out via a lithography apparatus comprising an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Therefore, projection or used light is used for imaging a lithographic structure onto the image or wafer plane. The aspiration to achieve ever smaller structures in the production of integrated circuits is currently driving the development of EUV lithography apparatuses that use projection or used light having a wavelength in the range of 0.1 nm to 30 nm, in particular 13.5 nm. In the case of such EUV lithography apparatuses, because of the high absorption of light of this wavelength by most materials, reflective optical units, that is to say mirrors, are used instead of—as previously—refractive optical units, that is to say lens elements.

In the case of such small structures it can be important to achieve a high imaging quality. This also applies in particular to processes with multiple exposures. For this reason, any fault sources that contribute to an impairment of the imaging are desirably taken into consideration and at best eliminated. Typical imaging aberrations can be minimized via adaptive optical units, for example. Vibrations, in particular, can have a great influence. They can arise in all regions of a lithography apparatus itself, for example as a result of flowing cooling water or airstreams and also as a result of human activity in the building or as a result of traffic in the vicinity. Vibrations can have the effect of causing optical elements themselves to oscillate, wherein for example the surface thereof can deform, which adversely affects the properties of the optical element. Particularly in the case of mirrors, faults of this type can have a double effect since an error in the angle of incidence induces an error of identical magnitude in the angle of reflection.

There are various measures for mechanically decoupling sensitive components or assemblies, for example the projection optical unit of a lithography apparatus, from the environment. However, in the case of adaptive optical units both control signals are transmitted for components, such as actuators or sensors, between the optical unit and an external controller and a supply voltage to the active components. Signal and power lines are used for this. Depending on the desired properties of the lithography apparatus, the line cables are insulated and/or shielded. Particularly in the case of signal lines it is desirable to shield the lines from unwanted influences in order to ensure an error-free signal transmission. This is achieved for example via a multilayered construction, as in the case of multiply shielded signal lines or coaxial cables. Such a multilayered construction of a cable can lead to a not inconsiderable stiffness of the cable. Such a stiff cable can also produce a mechanical coupling of an outer frame to the projection optical unit or the various active components. A large number of controllable components can involve a correspondingly large number of cables, which correspondingly amplifies the mechanical coupling. By way of example, four cores are used for a connection according to USB 1.0 specification: Ground, +5V, data+, data−. The USB 3.1 specification already stipulates 24 cores combined for example in a cable. The more cores a cable has, the stiffer it can become. Correspondingly there can also be an increase in a mechanical coupling strength over the cable. The mechanical coupling likewise can increase if a plurality of cables are used.

One possibility for reducing the number of cables involves wireless communication. For this purpose, however, all mechatronic components are desirably equipped with a corresponding receiver. This type of data transmission can be more susceptible to interference in comparison with cable-connected systems. Furthermore, the data transmission rate can be limited to a greater extent. Finally, a power supply is typically used for these systems as well, and so at least a certain number of wired transmissions are typically present.

Known cable-connected systems use for example cable loops and longer cables than necessary in order to reduce the transmission of vibrations via the cables. In order to realize a low mechanical coupling, for example the cable length is chosen depending on a cable stiffness. However, this approach can involve a correspondingly large space and is therefore not always able to be used.

SUMMARY

The disclosure seeks to provide an improved device for transmitting electrical signals in a lithography apparatus.

In accordance with a first aspect, a device for transmitting electrical signals between a first interface element and a second interface element is proposed. The first interface element is arranged at a first structure of the lithography apparatus and the second interface element is arranged at a second structure of the lithography apparatus. An electrical conductor connects the two interface elements to one another. Furthermore, provision is made of a hollow body for the electromagnetic shielding of the electrical conductor, the hollow body surrounding the electrical conductor at least in sections. In this case, a gap in the hollow body or between the hollow body and one of the structures permits a relative movement of the first structure and the second structure, such that a mechanical decoupling of the first structure and the second structure is achieved.

The proposed device enables an optimum shielding of the electrical conductor from external interference fields. In this case, the hollow body serves as the shield, with the aim of keeping external electrical, magnetic and/or electromagnetic fields away from its interior or attenuating them. This is referred to hereinafter as electromagnetic shielding or else as shielding for short. Electrical conductors extending in the shielded interior of the hollow body can therefore be formed without an individual shielding or merely with a simple shielding. This makes it possible to improve a flexibility of the electrical conductor.

The electromagnetic shielding of the electrical conductor that is brought about by the hollow body has various positive effects, as illustrated below.

Electrical signals are present as digital signals, for example, which can form a data stream. By way of example, a sensor can transmit detected sensor data as a data stream to an evaluation device. Particularly in the case of digital data transmission, an error-free transmission is desirable since a payload data throughput can thereby be increased. The less susceptible to interference a digital signal connection is, the fewer check data packets are used to verify the transmitted payload data. In this case, the total quantity of data transmitted is composed at least of the payload data and the check data. The check data packets can be referred to as overhead since they do not contribute to the actual information transmission. Since sensor systems can detect a very large quantity of data in a short time, correspondingly fast data connections are desirable. If the overhead can be reduced, for example, then a correspondingly higher quantity of payload data can be transmitted.

By way of example, a temperature sensor can also be provided, the resistance value of which varies depending on its temperature. In this case, the sensor signal is an analog electrical signal. In the case of analog signals, too, electromagnetic interference fields can lead to an erroneous signal transmission. Furthermore, components connected to an electrical conductor can be very sensitive to voltage and/or current fluctuations that occur. Such fluctuations can be induced by external interference fields and can ultimately lead to the destruction of a component. By way of example, an actuation strength of a mechanical actuator can depend on a supply voltage. If interference fields cause voltage fluctuations of the supply voltage, this can thus lead to an erroneous actuation by the actuator.

In the present case, the term electromagnetic interference fields encompasses all conceivable types of influencing of an electrical signal. This is taken to mean for example also static or only very slowly varying electrical or magnetic fields.

A lithography apparatus comprises a plurality of structures, such as, for example, a light source, a beam shaping optical unit, a lithography mask, a projection optical unit, a wafer slide, and various further functional and/or stability-imparting structures. Particularly during the exposure of wafers it is important, during an exposure time, which can comprise for example from a fraction of a second to a number of seconds, to avoid relative movements in particular of a wafer to be exposed with respect to a generated image of the lithography mask. Unwanted displacements of individual optical components which can influence the imaging of the lithography mask by the projection lens should also be avoided. In this case, an amplitude of a relative movement should not exceed an envisaged maximum limit. The latter can be in the nanometers range. In order to ensure this, for example shocks, oscillations, impacts, vibrations and the like should be kept away from the lithography apparatus or from the structures of the lithography apparatus. In this case, it should be taken into consideration that for example electrical conductors and cables also generate a mechanical coupling. In order to minimize this mechanical coupling, with the proposed device it is possible for example to dispense with an individual cable shielding. Advantageously, it is thus possible to use flexible electrical conductors for connecting the two interface elements.

An interface element can be formed for example as a plug or a socket. The interface element can also be realized by individual pins or contact points. Advantageously, the first and second interface elements have an equal number of contacts. Each contact then involves an electrical conductor that is connected to the corresponding contact of the further interface element. A connection can be produced by plug connectors, for example. Adhesive bonding, soldering, pressing, welding and/or similar methods can also be used for connecting the electrical conductor to an interface element. Hereinafter, the interface element may also be referred to simply as interface for short.

The hollow body has an enclosure. The enclosure is produced in particular from a material having a good shielding property for the relevant interference fields. By way of example, the material can have good electrical conductivity for shielding electric fields. For shielding magnetic fields, in particular low-frequency magnetic fields, the material can be ferromagnetic, for example. The interior of the hollow body is then a volume shielded from electromagnetic interference fields. An electrical conductor extending through the interior is therefore shielded at least in the region of the interior. Hereinafter, the term hollow body can denote both the entire volume encompassed by the hollow body and just the enclosure of the hollow body.

The hollow body can be produced for example from a rigid, self-supporting material. The hollow body can also comprise different materials. By way of example, the hollow body can have a supporting structure covered with a metallic net. Such an embodiment of the hollow body can afford weight advantages and be able to be used more flexibly.

The hollow body has a gap, for example. In this case, the gap is created such that electromagnetic interference fields cannot or at least cannot significantly penetrate through the gap into the interior of the hollow body. This can be achieved via a corresponding dimensioning of the gap. In this case, it is advantageous for the gap not to be made larger than desired.

However, the hollow body can also be formed such that it forms a gap together with one of the two structures.

A relative movement between the two structures is possible on account of the gap. An intended displacement of the two structures with respect to one another is of lesser importance here, although this is also one possible application of the device. In particular, no oscillations, vibrations, impacts or further mechanical impulses are transmitted from the first structure to the second structure by the hollow body. On account of the shielded interior of the hollow body, electrical conductors and/or cables extending in the interior of the hollow body can be constructed more simply; in particular, shielding measures can be reduced. This in turn has the consequence that a mechanical coupling of the interface elements via the electrical conductor and/or the cable can be reduced. Overall, the proposed device is thus suitable for a cable-connected electrical signal transmission between two interface elements with minimized mechanical coupling.

In accordance with a first embodiment, the device is arranged in a vacuum housing. The vacuum housing can also be referred to as an evacuated housing.

Lithography apparatuses can have evacuated housings since this can be advantageous for the UV radiation used. Particularly in the case of EUV lithography apparatuses, the projection light is preferably passed through vacuum since even typical gases exhibit an unwanted absorption of the EUV radiation. By way of example, the projection lens overall can be evacuated. The housing of the projection lens then constitutes a vacuum housing. The first interface element can be arranged for example on an inner side of the projection lens and the second interface element can be arranged for example at a lens element or mirror mount mechanically decoupled from the projection lens.

In accordance with a further embodiment of the device, the electrical conductor is formed at least in sections as a flexible printed circuit board.

A flexible printed circuit board comprises a flexible substrate, for example. The substrate can consist of polyamide and/or polyimide, for example. By way of example, a conductor track is applied on the substrate. The conductor track can consist of copper, for example. In this case, the conductor track can be adhesively bonded onto the substrate or be welded thereto, for example. Since the flexible substrate provides a structural integrity and mechanical stability, the conductor track can have a very small cross section. By way of example, a conductor track can have a rectangular cross section having a height of a few micrometers. On account of the small height, the conductor track permits a variable curvature about an axis along the width of the conductor track. Overall, the flexible printed circuit board therefore has a high flexibility, which contributes to a reduced mechanical coupling strength.

A flexible printed circuit board can also have a multilayered construction. In this case, each layer can take up conductor tracks. Preferably, an insulating layer is inserted respectively between two layers with a conductor track. In a layer, a plurality of conductor tracks can also be arranged alongside one another.

This embodiment is particularly advantageous if there is little space for cabling.

In accordance with a further embodiment of the device, the hollow body is arranged at the first structure and is conductively connected thereto. Furthermore, the hollow body has an opening facing the second structure. The opening is bounded by an edge of the hollow body which together with the second structure forms the gap.

In this embodiment, the hollow body is thus an integral body. In this case, the edge of the hollow body can have a predefined shape; by way of example, the edge can be formed by a circumferential surface which is curved in each case in sections in a manner corresponding to a curvature of the second structure. However, the edge can also be formed only by a cross section of the enclosure of the hollow body. In this case, the gap which permits a relative movement of the hollow body with respect to the second structure and thus also a relative movement of the first structure with respect to the second structure forms between the edge and the second structure.

On account of the conductive connection of the hollow body to the first structure, the potential of the hollow body is equal to the potential of the first structure. Advantageously, the second structure also has this potential, for example a ground potential.

In accordance with a further embodiment of the device, the hollow body comprises two partial bodies. A first partial body is arranged at the first structure and is conductively connected thereto. A second partial body is arranged at the second structure and is conductively connected thereto. The gap is formed in an overlap section between the two partial bodies in the hollow body.

The two partial bodies of the hollow body can be formed identically, but also differently. By way of example, it is conceivable for the first partial body to be formed from a solid metal and for the second partial body to have a multipartite enclosure. By way of example, the second partial body can be formed from a carrying skeleton structure and a shielding net structure bearing on the skeleton structure. The partial bodies are conductively connected to the respective structure, as a result of which they have the respective potential of the structure. Advantageously, the potential of the first structure and the potential of the second structure are the same potential, for example a ground potential. The partial bodies can also have different potentials.

The two partial bodies have in particular an overlap section. For this purpose, the partial bodies are shaped in the overlap section such that they have a geometrically similar shape. By way of example, the two partial bodies are formed as tubes having a circular cross section. Advantageously, in the overlap section the external radius of one partial body is smaller than the internal radius of the other partial body. The partial bodies can then be pushed a little way into one another, which entails an enlarged overlap section having improved shielding properties vis-à-vis a gap having a smaller overlap section. However, it is also possible for the two partial bodies to have an identical shape and identical size and for the gap to be formed between the abutment-side cross sections of the enclosures.

In accordance with a further embodiment of the device, a first printed circuit board, which is electrically connected to the first interface element, is provided in the first partial body. A second printed circuit board, which is electrically connected to the second interface element, is provided in the second partial body. Furthermore, the first printed circuit board is connected to the second printed circuit board via the electrical conductor.

In this case, the first printed circuit board and the second printed circuit board are formed in particular as rigid printed circuit boards. The printed circuit board is respectively connected to the interface element. In this case, the printed circuit board can be connected to the respective interface element via rigid wires, cables or lines since a mechanical decoupling is not crucial in the case of this connection. In this case, the printed circuit board can be configured to reproduce the contacts provided by the respective interface element. Alternatively, however, provision can also be made for electronic components such as signal amplifiers, voltage converters, switches, transistors, diodes and/or further components of this type already to be arranged on the printed circuit board. Since the printed circuit boards are arranged in the shielded interior of the hollow body, these components are automatically shielded from external interference fields.

This embodiment can also be advantageous if a relatively large path lies between the interface elements to be connected. In that case a large portion of the path can be connected to conventional conductors or cables, and just a shorter path between the two printed circuit boards, in particular the section over the gap, can be formed with a flexible conductor. Flexible conductors are usually more expensive than conventional conductors, which is why this can contribute to a reduction of costs.

In accordance with a further embodiment of the device, the first printed circuit board is connected to the second printed circuit board via the flexible printed circuit board.

In accordance with a further embodiment of the device, the flexible printed circuit board has a first edge section and a second edge section opposite the first edge section, wherein the flexible printed circuit board is rotated along its course in such a way that it has a section in which the first edge section and the second edge section form a helix shape.

In accordance with a further embodiment of the device, the flexible printed circuit board has at least one specific section which is bent and/or rotated.

In the present case, bent is understood to mean that the longitudinal axis of the specific section of the flexible printed circuit board is not a straight path, but rather an arc, for example.

In the present case, rotated is understood to mean that the normal vectors to the flexible printed circuit board in the specific section of the flexible printed circuit board have different directions and each group of three of the normal vectors are linearly independent with respect to one another. The latter property can also be described as follows: Each group of three of the normal vectors always span a three-dimensional space. This applies in particular to the normal vectors to the longitudinal axis of the specific section of the flexible printed circuit board.

A flexible printed circuit board is formed for example as a flat strip structure having a cross section having a large width and a small height perpendicular to a length of the flexible printed circuit board. The orientation of the strip structure in space can be described for example via a width vector, a height vector and a length vector. Such a strip structure has a flexibility in a direction perpendicular to the width vector, for example an x-direction. The flexibility in a direction along the width vector, for example a y-direction if x-y span a cartesian coordinate system, is significantly poorer, this being dependent on a width/height aspect ratio, for example. By virtue of the fact that the strip structure is rotated by 90° for example along a length of the flexible printed circuit board, the flexible printed circuit board thus has a flexibility in the x-direction in sections and a flexibility in the y-direction in further sections. Overall, a two-dimensional flexibility is thus achieved.

In this case, the flexible printed circuit board can be rotated by arbitrary degrees of rotation in the section. Advantageously, it is rotated at least by 90°. However, 180°, 270°, 360° or further degrees of rotation are also possible.

In accordance with a further embodiment, the device is arranged in a low-pressure atmosphere with elevated hydrogen content. The gap is then configured in such a way that penetration of hydrogen into the hollow body is reduced or suppressed. Penetration can also be understood to mean diffusion, for example.

Particularly in the case of EUV lithography apparatuses, contaminations can deposit on the reflective elements and impair the optical properties. One possibility for cleaning the optical elements is to irradiate them with hydrogen, wherein at least a portion of the hydrogen is present as atomic hydrogen, i.e. in dissociated form. The atomic hydrogen reacts with most contaminations to form volatile substances. However, atomic hydrogen also accumulates in the evacuated housing as a result of this cleaning method. On account of the reactivity of atomic hydrogen, it is advantageous if sensitive structures, in particular organic materials such as cable insulators, epoxy resins, adhesive bonds and flexible printed circuit boards, are protected against the atomic hydrogen.

In this embodiment, the gap is configured to restrict the penetration of atomic hydrogen. This ensures that the various parts or elements arranged in the hollow body, in particular cables, line insulations, printed circuit boards, interfaces and the like, are protected against the atomic hydrogen.

In accordance with a further embodiment of the device, a first pressure prevails on a first side of the first structure and a second pressure, which is increased by comparison with the first pressure, prevails on a second side of the first structure. The first interface element is formed on a printed circuit board on the first side, wherein the printed circuit board has a further interface element on the second side.

In this embodiment, the printed circuit board advantageously simultaneously serves as a vacuum bushing, which can reduce the structural complexity and lower costs.

In accordance with a further embodiment of the device, the first interface element and/or the second interface element are/is formed as a printed circuit board. This has the advantage that a wiring of the interface element to a printed circuit board can be obviated.

In accordance with a further embodiment of the device, the gap is formed in such a way that it permits a relative movement between the first structure and the second structure of at most 200 µm, preferably of at most 100 µm, more preferably of at most 10 µm.

The gap size depends in particular on the stipulation of the mechanical decoupling and the movement amplitudes that occur. Different structures, for example structures lying one inside another, can be mechanically decoupled multiply from further structures. By way of example, the housing of the projection optical unit can be decoupled from a housing encompassing the lithography apparatus. Furthermore, the optical elements of the projection optical unit themselves can be decoupled from the housing of the projection optical unit. Furthermore, a sensor, for example for detecting a deflection of a mirror, can once again be arranged in a decoupled fashion. In this case, by way of example, each stage of decoupling is accompanied by an increase in the desired properties for the decoupling, wherein the allowed and thus expected movement amplitudes of the structures to be decoupled decrease at the same time.

In this case, a narrower gap is advantageous for a shielding since electromagnetic interference fields can possibly penetrate through the gap to a lesser extent.

In accordance with a further embodiment of the device, the electrical conductor has a mechanical coupling strength of at most 200 N/m, preferably at most 100 N/m, more preferably at most 20 N/m and even more preferably at most 7 N/m.

The lower the mechanical coupling strength, the fewer vibrations or oscillations are transmitted by the electrical conductor.

In accordance with a further embodiment of the device, the electrical conductor is formed as part of a cable which connects the first interface element and the second interface element. The cable comprises a number of singly shielded core pairs and/or a number of voltage supply lines in a cable sheath.

A plurality of electrical conductors can be combined to form a cable. By way of example, a cable comprises five core pairs, each of which is configured for signal transmission. The core pairs are advantageously twisted since interference influences thus affect both cores equally. In the case of differential signal transmission, an interference influence is thus largely averaged out. The core pairs are shielded in each case, for example, in order not to mutually influence one another. The five twisted and singly shielded core pairs are combined in a cable. Since the cable extends in the hollow body, an outer shielding of the cable can be dispensed with. This is crucially advantageous for the flexibility of the cable since a cable shielding, for example with a flexible wire net, causes a large part of the stiffness of a cable shielded in this way.

In accordance with a further embodiment of the device, the flexible printed circuit board comprises a plurality of conductor tracks in a plurality of layers, wherein at least one conductor track extends in at least every second layer.

By choosing the dimensioning of individual conductor tracks and also an arrangement of the individual conductor tracks accordingly, it is possible to realize at least singly shielded conductor track pairs with a flexible printed circuit board as well. By way of example, two conductor tracks are arranged alongside one another on a central layer. In each case on the outer area alongside these conductor tracks on the central layer, provision is made of two further conductor tracks connected to a ground potential. Furthermore, a respective conductor track is provided in an upper layer and in a lower layer, the width of these conductor tracks being chosen such that they overlap the four conductor tracks arranged on the central layer. The conductor tracks of the upper layer and the lower layer are likewise connected to a ground potential. Such an arrangement enables a single shielding of the two conductor tracks mentioned first, which constitute inner conductor tracks for example for differential signal transmission. Besides this exemplary embodiment, various further arrangements are conceivable which can contribute to an improved shielding.

In accordance with a further embodiment of the device, the gap is formed by a first edge structure of the first partial body in the region of the overlap section and a second edge structure of the second partial body, the second edge structure corresponding to the first edge structure. In this case, the first edge structure and the second edge structure are intermeshing structures.

Consequently, the first edge structure and the second edge structure form a piece and a counterpiece. In this embodiment, penetration of electromagnetic interference fields into the interior can be efficiently suppressed. Furthermore, penetration, in particular hydrogen diffusion, can also be inhibited by this approach.

In accordance with a further embodiment of the device, the hollow body is arranged at the first structure and is conductively connected thereto. Furthermore, it is formed as an integral hollow body having an opening facing the second structure. The edge of the hollow body toward the opening together with the second structure forms the gap. In this case, the second structure comprises in particular an edge structure corresponding to the edge of the hollow body.

In this case, the edge structure of the second structure does not belong to the hollow body. The edge structure makes it possible, in particular, even in the case of a hollow body formed in an integral fashion, to achieve an improved shielding from electromagnetic interference fields in the region of the edge and reduced penetration of gas atoms.

In accordance with a second aspect, a lithography apparatus comprising a device for transmitting electrical signals in accordance with the first aspect or one of the embodiments of the first aspect is proposed.

In accordance with a third aspect, a device for transmitting electrical signals in a lithography apparatus is proposed. The device comprises a first interface element, which is arranged at a first structure of the lithography apparatus, and a second interface element, which is arranged at a second structure of the lithography apparatus. The first interface element is connected to the second interface element via a flexible printed circuit board for the transmission of electrical signals. The flexible printed circuit board comprises a plurality of layers, wherein at least three layers with conductor tracks are provided, the layers lying one above another. The conductor tracks are arranged in such a way that at least one conductor track arranged in a central layer is electromagnetically shielded by further conductor tracks in the central layer and/or in further layers.

In this case, the embodiments of the first aspect also constitute embodiments of the third aspect.

Further possible implementations of the disclosure also comprise not explicitly mentioned combinations of features or embodiments that are described above or below with respect to the exemplary embodiments. In this case, the person skilled in the art will also add individual aspects as improvements or supplementations to the respective basic form of the disclosure.

Further advantageous configurations and aspects of the disclosure are the subject matter of the claims and also of the exemplary embodiments of the disclosure described below.

BRIEF DESCRIPTION OF THE DRAWINGS

In the text that follows, the disclosure is explained in more detail on the basis of preferred embodiments with reference to the accompanying figures, in which.

EXEMPLARY EMBODIMENTS OF THE DISCLOSURE

Identical elements or elements having an identical function have been provided with the same reference signs in the figures, unless indicated otherwise.

Figure 1A:
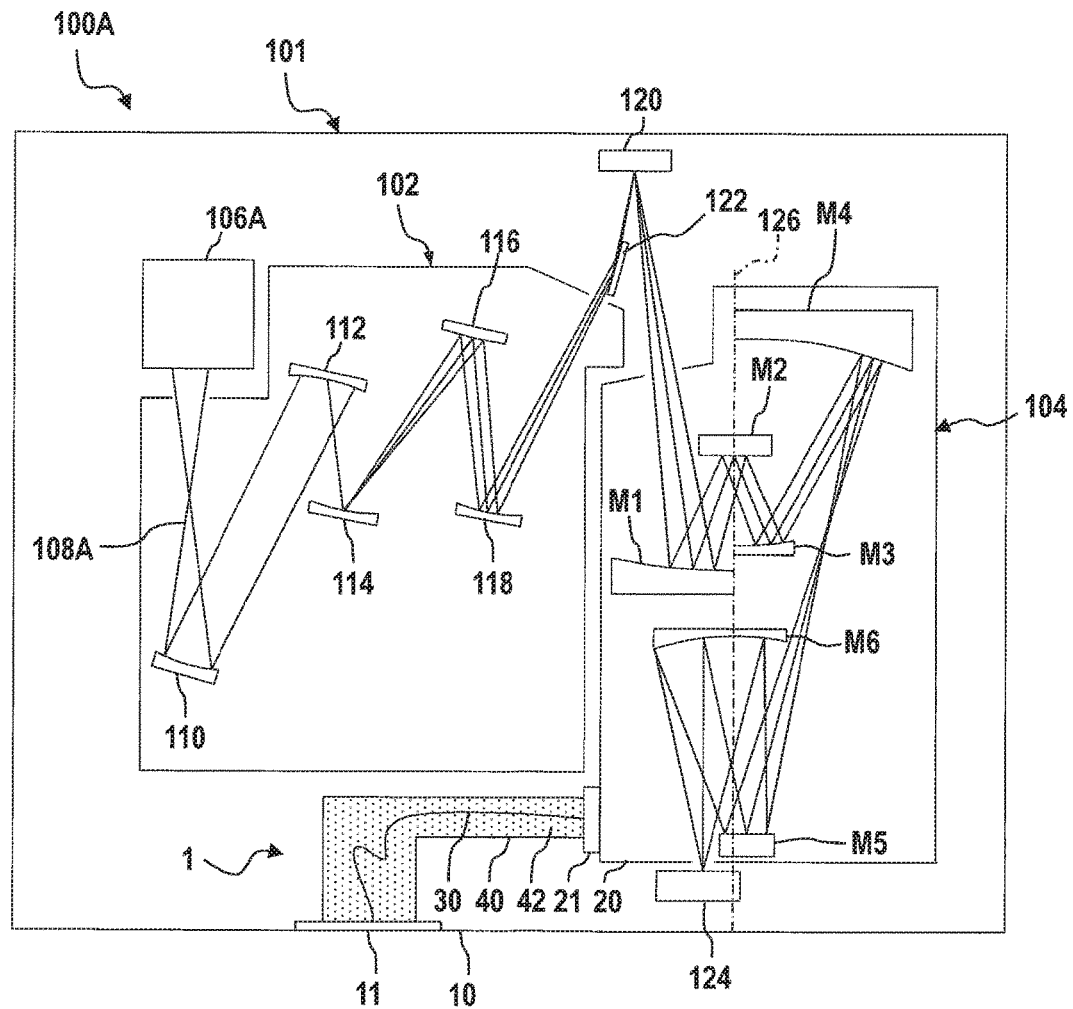
FIG. 1A shows a schematic view of an EUV lithography apparatus.

FIG. 1A shows a schematic view of an EUV lithography apparatus 100A, which comprises a beam shaping and illumination system 102 and a projection system 104. In this case, EUV stands for "extreme ultraviolet" (EUV) and denotes a wavelength of the working light (also called used radiation) of between 0.1 and 30 nm. The beam shaping and illumination system 102 and the projection system 104 are arranged in a vacuum housing 101. The vacuum housing 101 is evacuated with the aid of an evacuation device (not illustrated). The vacuum housing 101 is surrounded by a machine room (not illustrated) in which, for example, controllers for setting the optical elements are provided.

For transmitting the electrical signals, the lithography apparatus 100A comprises a device 1. The device 1 comprises a first interface 11, which is arranged at a first structure 10, which in the present case constitutes a housing part of the vacuum housing 101. Furthermore, the device 1 comprises a second interface 21, which is arranged at a second structure 20. In the present case, the second structure 20 is a part of the housing of the projection system 104. Furthermore, the device 1 comprises a hollow body 40 and an electrical conductor 30 extending in the hollow body 40 and connecting the first interface 10 to the second interface 20. In particular, the hollow body 40 is configured such that its interior constitutes a volume 42 which is substantially free of electromagnetic interference fields. Various exemplary embodiments of the device 1 are shown in FIG. 2-FIG. 6.

The EUV lithography apparatus 100A comprises an EUV light source 106A. A plasma source (or a synchrotron), which emits radiation 108A in the EUV range (extreme ultraviolet range), i.e., for example, in the wavelength range of 0.1 nm to 30 nm, may be provided, for example, as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is directed onto the photomask (reticle) 120. The photomask 120 is formed for example as a reflective optical element and can be arranged outside the systems 102, 104. Furthermore, the EUV radiation 108A can be directed onto the photomask 120 via a mirror 122. The photomask 120 comprises structures which are imaged onto a wafer 124 or the like in a reduced manner via the projection system 104. In this case, the wafer 124 is arranged in the image plane of the projection system 104.

The projection system 104 (also referred to as projection lens) has six mirrors M1-M6 for imaging the photomask 120 onto the wafer 124. In this case, individual mirrors M1-M6 of the projection system 104 may be arranged symmetrically in relation to the optical axis 126 of the projection system 104. It should be noted that the number of mirrors of the EUV lithography apparatus 100A is not restricted to the number illustrated. A greater or lesser number of mirrors can also be provided. Furthermore, the mirrors, as a rule, are curved on their front side for beam shaping.

Figure 1B:
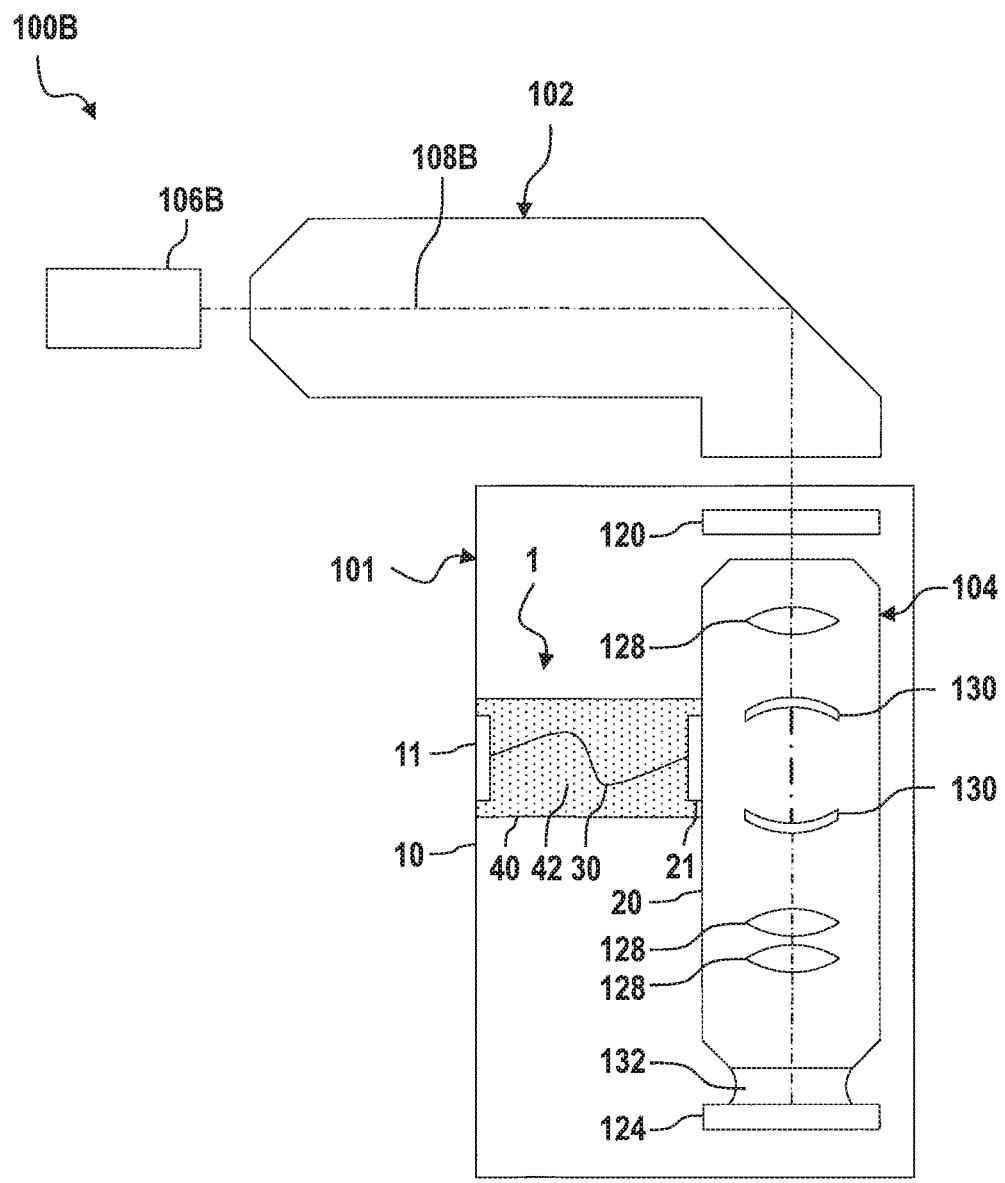
FIG. 1B shows a schematic view of a DUV lithography apparatus.

FIG. 1b shows a schematic view of a DUV lithography apparatus 100B, which comprises a beam shaping and illumination system 102 and a projection system 104. In this case, DUV stands for "deep ultraviolet" (DUV) and denotes the wavelength of the working light (also called used radiation) of between 30 and 250 nm. The beam shaping and illumination system 102 and the projection system 104—as already described with reference to FIG. 1A—can be arranged in a vacuum housing and/or be surrounded by a machine room having corresponding control devices. FIG. 1b only shows a vacuum housing 101 comprising the projection system 104, the photomask 120 and a device 1. The device 1—as likewise described with reference to FIG. 1A—is configured for electrical signal transmission to the projection system 104. Various exemplary embodiments of the device 1 are shown in FIG. 2-FIG. 6.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 comprises structures which are imaged onto a wafer 124 or the like in a reduced manner via the projection system 104. In this case, the wafer 124 is arranged in the image plane of the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to the optical axis 126 of the projection system 104. It should be noted that the number of lens elements and mirrors of the DUV lithography apparatus 100B is not restricted to the number illustrated. A greater or lesser number of lens elements and/or mirrors can also be provided. Furthermore, the mirrors are generally curved on their front face for beam shaping.

An air gap between the last lens element 128 and the wafer 124 can be replaced by a liquid medium 132 which has a refractive index of >1. The liquid medium can be high-purity water, for example. Such a construction is also referred to as immersion lithography and has an increased photolithographic resolution.

The exemplary embodiments of the device 1 as shown in FIG. 2-FIG. 6 are in each case suitable for example for information, power or data transmission in one of the lithography apparatuses 100A, 100B shown in FIG. 1A and FIG. 1b.

Figure 2:
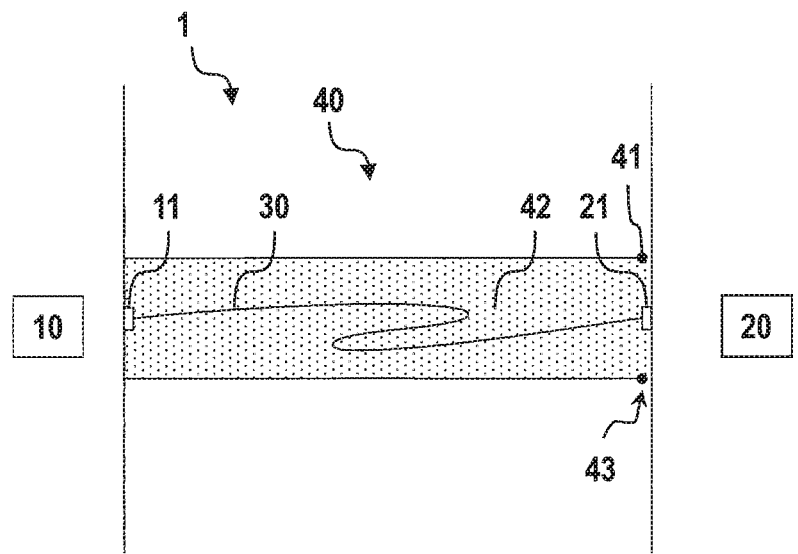
FIG. 2 shows a cross section of a first exemplary embodiment of the device for transmitting electrical signals.

FIG. 2 shows a cross section of a first exemplary embodiment of the device 1 for transmitting electrical signals between a first structure 10 and a second structure 20. In the first exemplary embodiment, the hollow body 40 is formed as an integral hollow body 40, which is arranged at the first structure 10 and is conductively connected thereto. It has an edge 41 forming an opening toward the second structure 20. A gap 43 is formed between the edge 41 and the second structure 20. The hollow body 40 encloses a volume 42, which is shown with a dotted background in FIG. 2 and which constitutes a volume 42 substantially free of interference fields. A first interface element 11 is arranged at the first structure 10 and is connected to a second interface element 21, which is arranged at the second structure 20, via an electrical conductor 30 formed as a flexible cable 30 and extending in the volume 42. On account of the gap 43, the second structure 20 and the hollow body 40 can move independently of one another provided that a movement amplitude is not larger than the gap 43. The first structure 10 and the second structure 20 and also the hollow body 40 are connected to a ground potential (not illustrated) in the exemplary embodiment.

Figure 3:
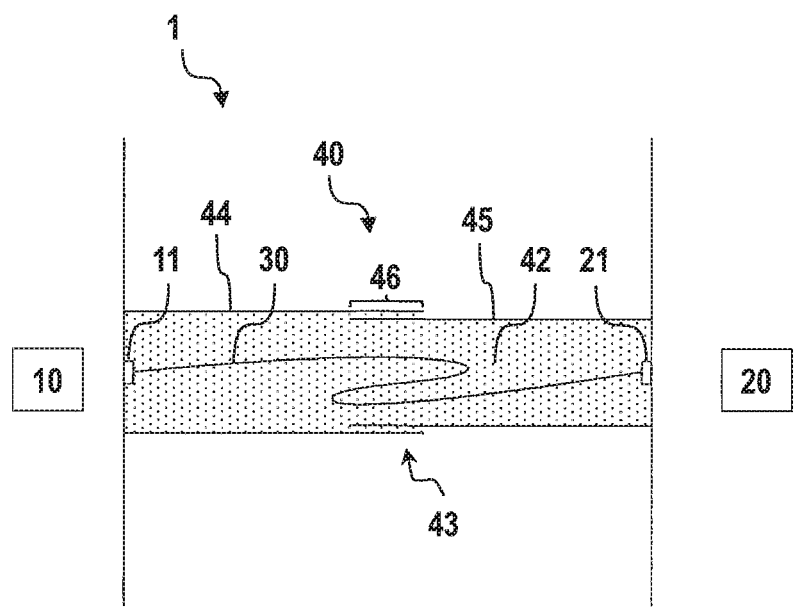
FIG. 3 shows a cross section of a second exemplary embodiment of the device for transmitting electrical signals.

FIG. 3 shows a cross section of a second exemplary embodiment of the device 1 for transmitting electrical signals between a first structure 10 and a second structure 20. In this exemplary embodiment, the hollow body 40 comprises two partial bodies 44 and 45, which overlap in an overlap section 46. The gap 43 is formed in the overlap section 46. The first partial body 44 is arranged at the first structure 10 and is conductively connected thereto. The second partial body 45 is arranged at the second structure 20 and is conductively connected thereto. The further features correspond to those of the first exemplary embodiment in FIG. 2.

Figure 4:
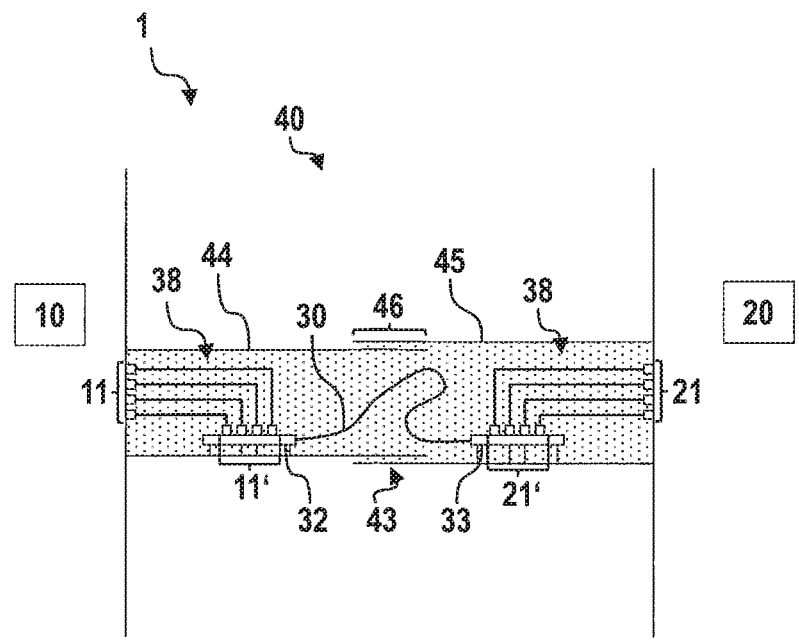
FIG. 4 shows a cross section of a third exemplary embodiment of the device for transmitting electrical signals.

FIG. 4 shows a cross section of a third exemplary embodiment of the device 1 for transmitting electrical signals between a first structure 10 and a second structure 20. In this exemplary embodiment, the hollow body 40, as in the second exemplary embodiment in FIG. 3, is constructed in a bipartite fashion. Furthermore, printed circuit boards 32, 33 are provided here, wherein a respective printed circuit board 32, 33 is arranged in one of the partial bodies 44, 45. The first interface element 11 comprises four individual interfaces, which are connected to corresponding contacts 11' on the first printed circuit board 32 via rigid lines 38. The interface element 21 also comprises four individual interfaces, which are connected to corresponding contacts 21' on the second printed circuit board 33 via rigid lines 38. The first printed circuit board 32 is connected to the second printed circuit board 33 via a flexible cable 30 having the desired number of individual cores. The further features of this exemplary embodiment correspond to those of the exemplary embodiment in FIG. 3.

Figure 5:
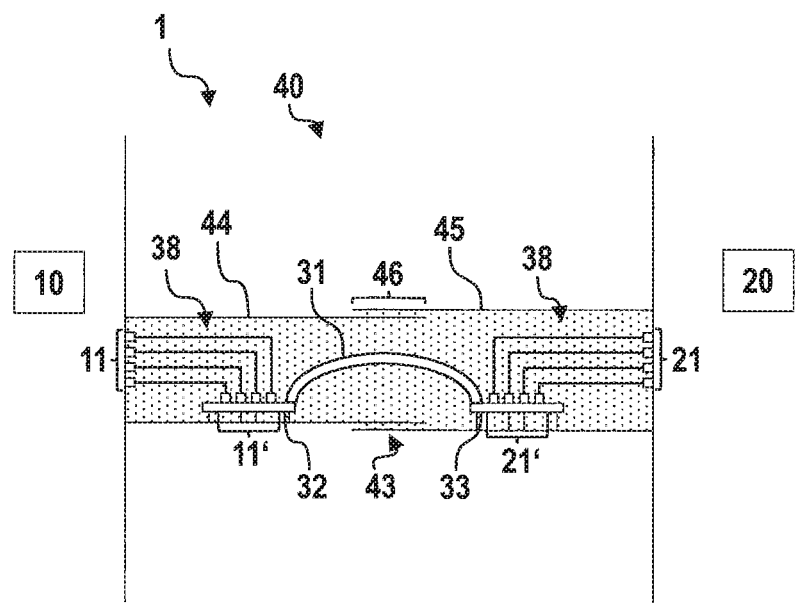
FIG. 5 shows a cross section of a fourth exemplary embodiment of the device for transmitting electrical signals.

FIG. 5 shows a cross section of a fourth exemplary embodiment of the device 1 for transmitting electrical signals between a first structure 10 and a second structure 20. The fourth exemplary embodiment shown differs from the third exemplary embodiment in FIG. 4 in that instead of the flexible cable 30 a flexible printed circuit board 31 connects the two printed circuit boards 32 and 33 arranged in the partial bodies 44, 45. The further features correspond to those of the third exemplary embodiment.

Figure 6:
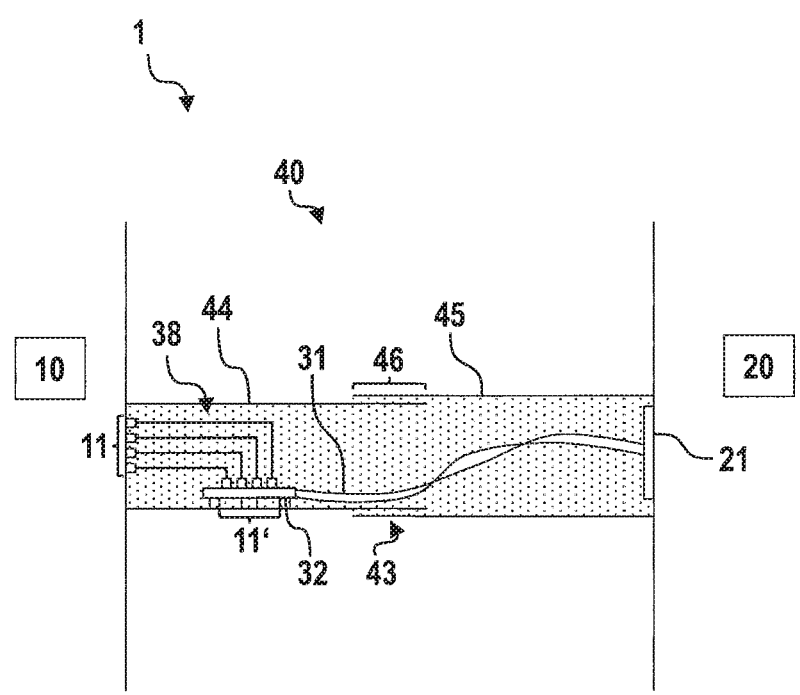
FIG. 6 shows a cross section of a fifth exemplary embodiment of the device for transmitting electrical signals.

FIG. 6 shows a cross section of a fifth exemplary embodiment of the device 1 for transmitting electrical signals between a first structure 10 and a second structure 20. This exemplary embodiment differs from the fourth exemplary embodiment in FIG. 5 in that the second interface element 21 is formed as a printed circuit board 21, which is connected to the first printed circuit board 32 in the first partial body 44 via a flexible printed circuit board 31. It can also be stated that the second printed circuit board 33 (see FIG. 5) is arranged at the second structure 20. The further features correspond to those of the third or else the fourth embodiment.

Over and above the illustration it is possible, alternatively or additionally, for the first interface element 11 to be formed as a printed circuit board.

Figure 7:
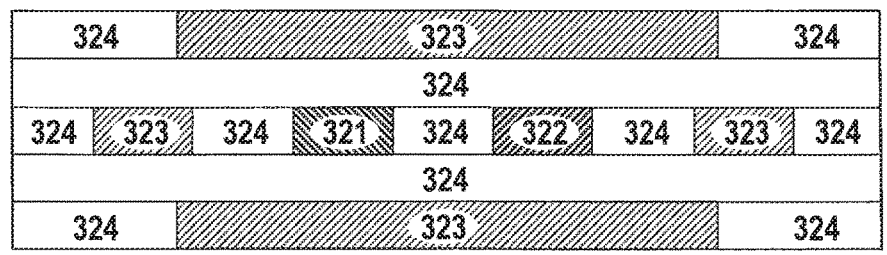
FIG. 7 shows a cross section of one exemplary embodiment of a flexible printed circuit board.

FIG. 7 shows a cross section of one exemplary embodiment of a flexible printed circuit board 31. The illustration is such that the flexible printed circuit board 31 enters the plane of the drawing or emerges from the plane of the drawing. The printed circuit board 31 illustrated comprises a total of five layers arranged one above another. In this case, conductor tracks 321, 322, 323 are respectively provided in a first, third and fifth layer. A second and fourth layer serve as a substrate for the flexible printed circuit board 31, which substrate mechanically stabilizes the latter, keeps the layers together and insulates conductor tracks 321, 322, 323 arranged one above another from one another. The substrate material 324 is polyimide, for example. In the third layer, in particular, a plurality of conductor tracks 321, 322, 323 are arranged alongside one another and are insulated from one another by the substrate material 324 arranged therebetween. In this exemplary embodiment, the conductor tracks 321 and 322 serve for signal transmission, wherein a differential signal transmission can be provided. In each case wide conductor tracks 323 are provided in the first and fifth layers. The conductor tracks 323 are connected to a ground potential. The arrangement shown thus has shielding properties for the centrally arranged conductor tracks 321 and 322. A flexible printed circuit board 31 constructed in accordance with this exemplary embodiment is suitable for example for use in the device 1 in accordance with any of the abovementioned exemplary embodiments of the device 1.

Figure 8A:
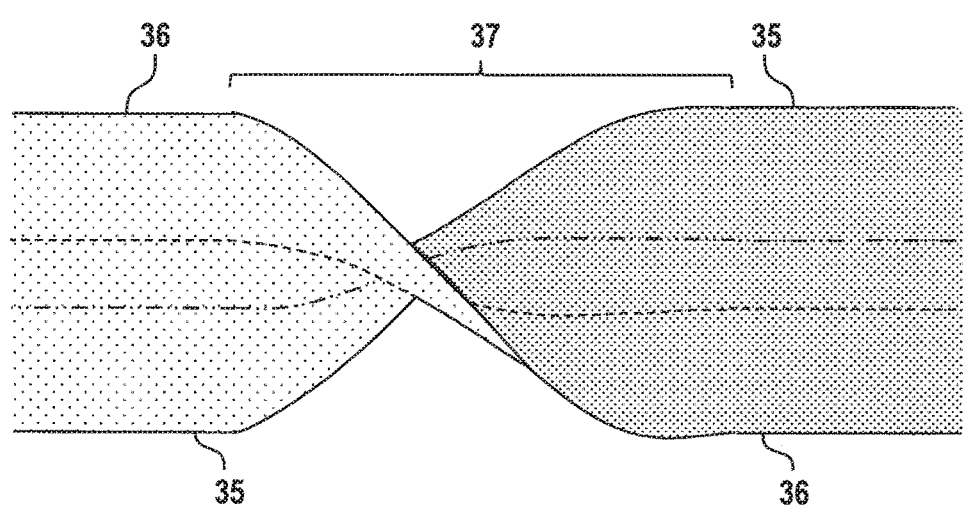
FIG. 8A schematically shows an excerpt from a flexible printed circuit board rotated in one section to form a helix shape.

FIG. 8A schematically shows an excerpt from a flexible printed circuit board 31 rotated in one section to form a helix shape. The flexible printed circuit board 31 extends from left to right in this illustration. Furthermore, a top side and an underside of the printed circuit board 31 are identified by different hatchings in the illustration. The flexible printed circuit board 31 comprises a first edge section 35 and a second edge section 36 lying opposite. Coming from the left, the second edge section 36 is an upper edge section. In this orientation, the top side of the printed circuit board 31 points out of the plane of the drawing. Along the course of the printed circuit board 31 toward the right, the printed circuit board 31 comprises a section 37 in which the flexible printed circuit board 31 is rotated. The edge sections 35, 36 form a helix shape in the section 37. The degree of rotation in this exemplary embodiment is 180°, for example. This has the effect that further toward the right, following the section 37, the edge sections are interchanged, such that now the first edge section 35 is an upper edge section. Furthermore, in this orientation, now the underside of the printed circuit board 31 points out of the plane of the drawing. Furthermore, two auxiliary lines (not designated) are depicted in FIG. 8A, the auxiliary lines illustrating the change of orientation. The embodiment illustrated has a flexibility in the plane of the drawing which, without a rotated section 37, would not be present or would be present only very slightly.

Figure 8B:
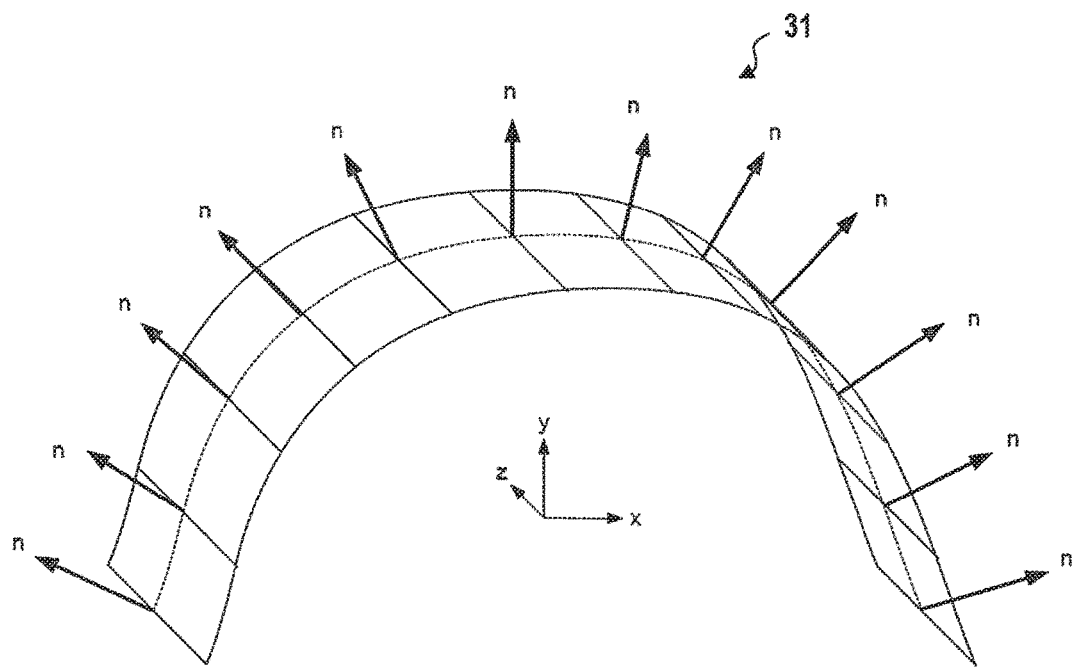
FIG. 8B shows a schematic view of one embodiment of a specific section of a flexible printed circuit board.

FIG. 8B shows a schematic view of one embodiment of a specific section of a flexible printed circuit board 31. The flexible printed circuit board 31 in FIG. 8B extends from left to right in this illustration. The specific section of the flexible printed circuit board 31 in FIG. 8B is bent. In other words, the longitudinal axis of the section of the flexible printed circuit board 31 does not form a straight path, but rather an arc. The normal vectors n to the longitudinal axis of the flexible printed circuit board 31 in FIG. 8B have different directions and lie in a plane.

Figure 8C:
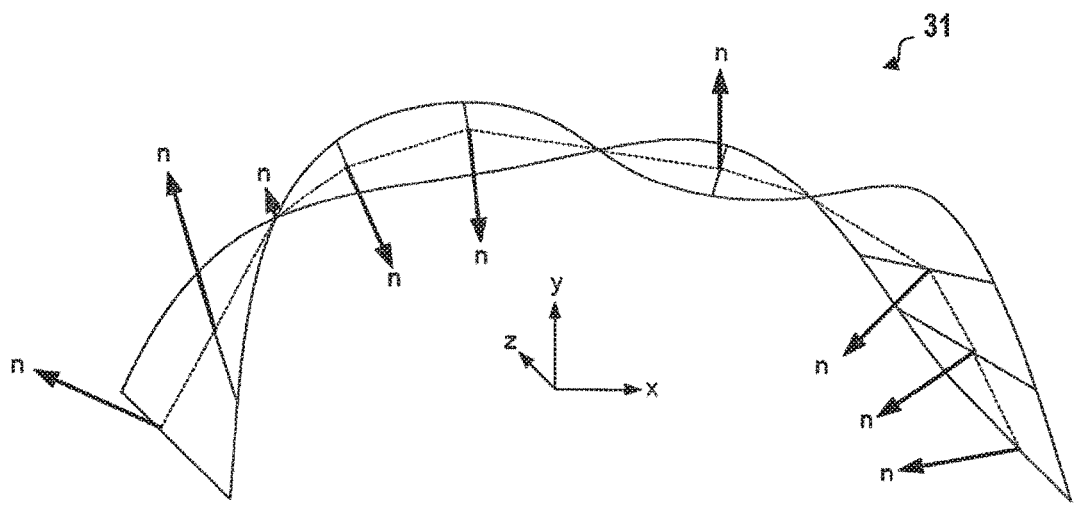
FIG. 8C shows a schematic view of a further embodiment of a specific section of a flexible printed circuit board.

FIG. 8C shows a schematic view of a further embodiment of a specific section of a flexible printed circuit board 31. The specific section of the flexible printed circuit board 31 in accordance with FIG. 8C is rotated. Rotated here means that the normal vectors n to the longitudinal axis of the specific section of the flexible printed circuit board 31 have different directions in the specific section and each group of three of the normal vectors n are linearly independent with respect to one another. The latter property can also be described by each group of three of the normal vectors n in FIG. 8C always spanning a three-dimensional space.

Figure 9:
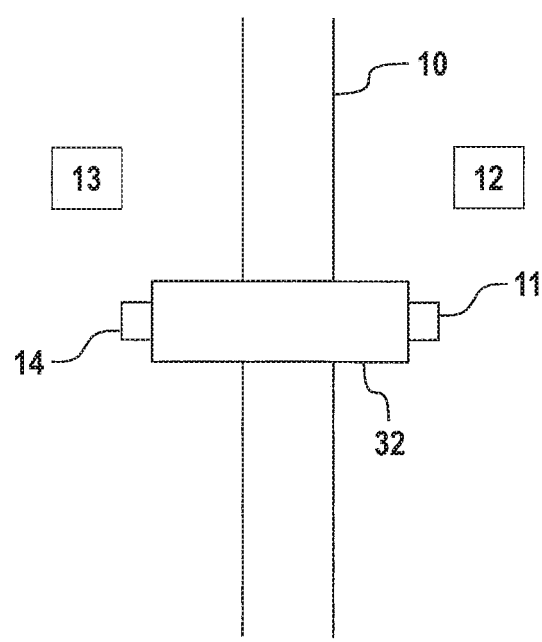
FIG. 9 schematically shows one exemplary embodiment of a printed circuit board as a vacuum bushing.

FIG. 9 schematically shows one exemplary embodiment of a printed circuit board 32 used as a vacuum bushing. For this purpose, the printed circuit board 32 is incorporated into the first structure 10. A first pressure prevails on a first side 12 of the first structure 10 and a second pressure, which is increased by comparison with the first pressure, prevails on a second side 13 of the first structure 10. The first interface element 11 is formed on the printed circuit board 32 on the first side 12 and a further interface element 14 is formed on the printed circuit board 32 on the second side 13. The arrangement shown can analogously also be applied to the second structure 20 (see any of FIGS. 1-6).

Figure 10A:
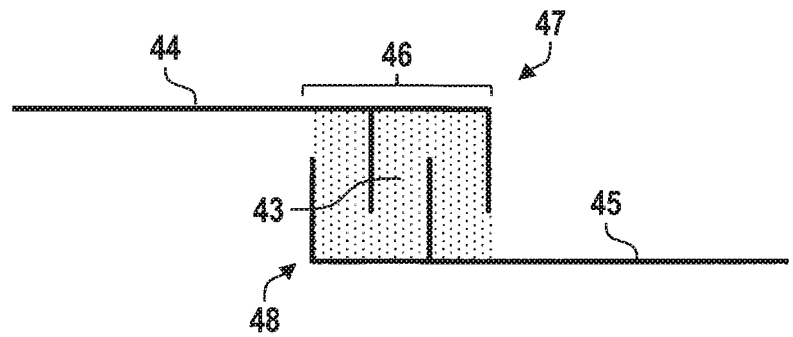
FIGS. 10A-10C show various exemplary embodiments of edge structures for forming a gap.
Figure 10B:
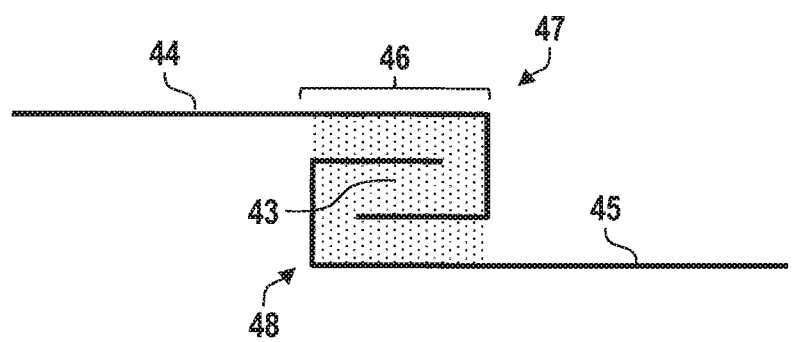
Figure 10C:
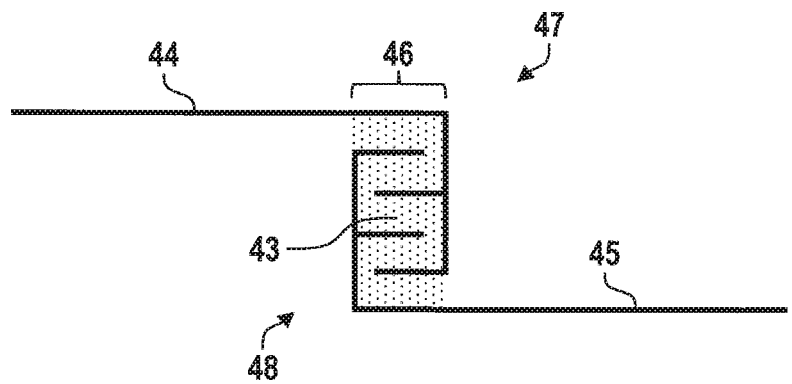

FIG. 10A-FIG. 10C show various exemplary embodiments of edge structures 47, 48 for forming a gap 43. The exemplary embodiments shown are based on a hollow body 40 formed in a bipartite fashion, for example in accordance with the second, third, fourth or fifth exemplary embodiment of the device 1. In this case, the edge structure 47 is assigned to the partial body 44 and the edge structure 48 is assigned to the partial body 45. The edge structure 47 forms for example a piece and the edge structure 48 forms a counterpiece. The two edge structures 47, 48 overlap in the overlap section 46. The gap 43 formed between the edge structures 47, 48 extends in each case in a serpentine fashion in FIGS. 10A-10C. This can also be referred to as a zigzag shape or a meandering shape. Such a gap shape can improve a shielding. Furthermore, such a gap shape can constitute an improved penetration barrier or diffusion barrier.

Besides the illustration with two partial bodies 44, 45, it is possible for one of the edge sections 47, 48 to be arranged directly at one of the structures 10, 20. In that case the hollow body 40 can also be formed in an integral fashion, for example as is shown in the first embodiment of the device 1.

Although the present disclosure has been described on the basis of exemplary embodiments, it is modifiable in diverse ways.

LIST OF REFERENCE SIGNS

1 Device
10 First structure
11 First interface element
11' Contact
12 First side of the first structure
13 Second side of the first structure
14 Further interface element
20 Second structure
21 Second interface element
21' Contact
30 Electrical conductor
31 Flexible printed circuit board
32 First printed circuit board
33 Second printed circuit board
35 First edge section
36 Second edge section
37 Section
38 Lines
40 Hollow body
41 Edge
42 Electromagnetically shielded volume
43 Gap
44 First partial body
45 Second partial body
46 Overlap section
47 Edge structure
48 Edge structure
100 Lithography apparatus
100A EUV lithography apparatus
100B DUV lithography apparatus
101 Vacuum housing
102 Beam shaping and illumination system
104 Projection system
106A EUV light source
106B DUV light source
108A EUV radiation
108B DUV radiation
110-118 Mirrors
120 Photomask
122 Mirror
124 Wafer
126 Optical axis
128 Lens element
130 Mirror
132 Immersion liquid
321 Conductor track
322 Conductor track
323 Conductor track
324 Substrate material
M1-M6 Mirrors
n Normal vector

What is claimed is:

1. A device, comprising:
an electrical conductor electrically connecting a first interface element to a second interface element, the first interface element arranged at a first structure, and the second interface element arranged at a second structure; and
a hollow body surrounding at least portions of the electrical conductor to electromagnetically shield the electrical conductor,
wherein:
the hollow body comprises first and second partial hollow bodies;
the first partial hollow body contacts the first section;
the first partial hollow body is electrically conductively connected to the first structure;
the second partial hollow body contacts the second structure;
the second partial hollow body is electrically conductively connected to the second structure;
the hollow body has a gap in an overlap section between the first and second partial hollow bodies; and
the gap is configured to permit relative movement between the first and second structures to mechanically decouple the first structure from the second structure.

2. The device of claim 1, wherein at least sections of the electrical conductor comprise a flexible printed circuit board.

3. The device of claim 2, wherein:
the flexible printed circuit board has a first edge section and a second edge section opposite the first edge section; and
in a section of the flexible printed circuit board, the first and second edge sections define a helix shape.

4. The device of claim 2, wherein a section of the flexible printed circuit board is bent.

5. The device of claim 2, wherein a section of the flexible printed circuit board is rotated.

6. The device of claim 1, further comprising first and second printed circuit boards, wherein:
the first printed circuit board is electrically connected to the first interface element;
the first printed circuit board is in the first partial hollow body;
the second printed circuit board is electrically connected to the second interface element;
the second printed circuit board is in the second partial hollow body; and
the electrical conductor electrically connects the first and second printed circuit boards.

7. The device of claim 6, wherein the electrical conductor comprises a flexible printed circuit board.

8. The device of claim 1, wherein:
the gap defined by a first edge structure of the first partial body in the overlap section and a second edge structure of the second partial body; and
the first and second edge structures comprise intermeshing structures.

9. The device of claim 1, wherein the gap is configured to permit relative movement between the first and second structures of at most 200 µm.

10. The device of claim 1, wherein the electrical conductor has a mechanical coupling strength of at most 200 N/m.

11. The device of claim 1, wherein:
the electrical conductor is a portion of a cable which connects the first and second interface elements; and
the cable comprises at least one member selected from the group consisting of a number of singly shielded core pairs in a cable sheath and a number of voltage supply lines in a cable sheath.

12. The device of claim 1, wherein the gap is configured so that, when the device is in a low pressure atmosphere with elevated hydrogen content, the gap suppresses penetration of hydrogen into the hollow body.

13. The device of claim 1, wherein:
a housing defines the first structure;
a first side of the first structure is exposed to a first pressure;
a second side of the first structure is exposed to a second pressure;
the second pressure is greater than the first pressure;
the first interface element is arranged on a printed circuit board on the first side of the first structure; and
the printed circuit board has a further interface element on the second side of the first structure.

14. The device of claim 1, wherein a vacuum housing defines the first structure.

15. An apparatus, comprising:
the device of claim 1,
wherein the apparatus is a lithography apparatus.

16. The apparatus of claim 15, wherein:
the apparatus comprises a vacuum housing and a projection system;
the first interface element is arranged at the vacuum housing; and
the second interface element is arranged at the projection system.

17. The apparatus of claim 16, wherein:
the gap defined by a first edge structure of the first partial body in the overlap section and a second edge structure of the second partial body; and
the first and second edge structures comprise intermeshing structures.

18. The apparatus of claim 15, further comprising first and second printed circuit boards, wherein:
the first printed circuit board is electrically connected to the first interface element;
the first printed circuit board is in the first partial hollow body;
the second printed circuit board is electrically connected to the second interface element;
the second printed circuit board is in the second partial hollow body; and
the electrical conductor electrically connects the first and second printed circuit boards.

19. The apparatus of claim 18, wherein the electrical conductor comprises a flexible printed circuit board.

20. The apparatus of claim 15, wherein at least sections of the electrical conductor comprise a flexible printed circuit board.

* * * * *